(12) United States Patent
Marsh et al.

(10) Patent No.: US 6,656,835 B2
(45) Date of Patent: Dec. 2, 2003

(54) PROCESS FOR LOW TEMPERATURE ATOMIC LAYER DEPOSITION OF RH

(75) Inventors: Eugene P. Marsh, Boise, ID (US); Stefan Uhlenbrock, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/884,997

(22) Filed: Jun. 21, 2001

(65) Prior Publication Data

US 2002/0197814 A1 Dec. 26, 2002

(51) Int. Cl.[7] .......................................... H01L 21/4763
(52) U.S. Cl. ....................................... 438/650; 438/686
(58) Field of Search .......................... 438/650, 686, 438/240, 396, 680, 681

(56) References Cited

U.S. PATENT DOCUMENTS

| 5,563,290 | A | * | 10/1996 | Ito | 560/193 |
| 6,323,511 | B1 | * | 11/2001 | Marsh | 257/295 |
| 6,387,802 | B1 | * | 5/2002 | Marsh | 438/680 |
| 6,482,740 | B2 | * | 11/2002 | Soininen et al. | 438/686 |
| 2002/0081381 | A1 | * | 6/2002 | DeleRosa et al. | 427/255.28 |
| 2002/0110991 | A1 | * | 8/2002 | Li | 438/347 |

* cited by examiner

Primary Examiner—Michael Trinh
(74) Attorney, Agent, or Firm—Dickstein Shapiro Morin & Oshinsky LLP

(57) ABSTRACT

A method for the formation of rhodium films with good step coverage is disclosed. Rhodium films are formed by a low temperature atomic layer deposition technique using a first gas of rhodium group metal precursor followed by an oxygen exposure. The invention provides, therefore, a method for forming smooth and continuous rhodium films which also have good step coverage and a reduced carbon content.

37 Claims, 6 Drawing Sheets

PROCESS FOR LOW TEMPERATURE ATOMIC LAYER DEPOSITION OF RH

FIELD OF THE INVENTION

The present invention relates to the field of semiconductor integrated circuits and, in particular, to a novel method for forming high quality rhodium (Rh) films.

BACKGROUND OF THE INVENTION

Thin film technology in the semiconductor industry requires thin deposition layers, increased step coverage, large production yields, and high productivity, as well as sophisticated technology and equipment for coating substrates used in the fabrication of various devices. For example, process control and uniform film deposition directly affect packing densities for memories that are available on a single chip or device. Thus, the decreasing dimensions of devices and the increasing density of integration in microelectronics circuits require greater uniformity and process control with respect to layer thickness.

Various methods for depositing thin films of complex compounds, such as metal oxides, ferroelectrics or superconductors, are known in the art. Current technologies include mainly RF sputtering, spin coating processes, and chemical vapor deposition (CVD), with its well-known variation called rapid thermal chemical vapor deposition (RTCVD). These technologies, however, have some disadvantages. For example, the RF sputtering process yields poor conformality, while the spin deposition of thin films is a complex process, which generally involves two steps: an initial step of spinning a stabilized liquid source on a substrate usually performed in an open environment, which undesirably allows the liquid to absorb impurities and moisture from the environment; and a second drying step, during which evaporation of organic precursors from the liquid may leave damaging pores or holes in the thin film. Further, both CVD and RTCVD are flux-dependent processes requiring uniform substrate temperatures and uniform distribution of the chemical species in the process chamber.

Promising candidates for materials for capacitor electrodes in IC memory structures include noble metals, such as platinum (Pt), palladium (Pd), iridium (Ir), ruthenium (Ru), rhodium (Rh) and osmium (Os), as wells as their conductive oxides (for example, ruthenium oxide ($RuO_2$), iridium oxide ($IrO_2$) or osmium oxide ($OSO_2$), among others). Although the above-mentioned noble metals are all physically and chemically similar, platinum (Pt) is most commonly used because platinum has a very low reactivity and a high work function that reduces the leakage current in a capacitor. Platinum is also inert to oxidation, thus preventing oxidation of electrodes which would further decrease the capacitance of storage capacitors. The use of platinum as the material of choice for capacitor electrodes poses, however, problems. One of them arises from the difficulty of etching and/or polishing platinum.

Recently, particular attention has been accorded to rhodium (Rh) as an alternative material to platinum because rhodium has excellent electrical properties which are the result of good electrical conductivity, good conductivity, good heat-transfer properties and high work function. Rhodium films are currently deposited by sputtering, CVD or RTCVD, among others. Although the CVD processing technologies afford good step coverage, as the geometries of the future generations of semiconductors become extremely aggressive, these processing technologies will not be able to afford better step coverage, that is a high degree of thickness and/or uniformity control over a complex topology for thin films of such future generation of semiconductors.

Accordingly, there is a need for an improved carbon-free rhodium film with good step coverage and improved electrical properties, as well as a new and improved method for forming such continuous and smooth rhodium films with good step coverage.

BRIEF SUMMARY OF THE INVENTION

The present invention provides a novel method for the formation of rhodium films with good step coverage which may be used as top and/or lower plate electrodes for a capacitor. Rhodium films are formed by a low temperature atomic layer deposition technique using a rhodium gas precursor followed by an oxygen exposure. The invention provides, therefore, a method for forming smooth and continuous rhodium films which also have good step coverage.

DETAILED DESCRIPTION OF THE INVENTION

Figure 1:
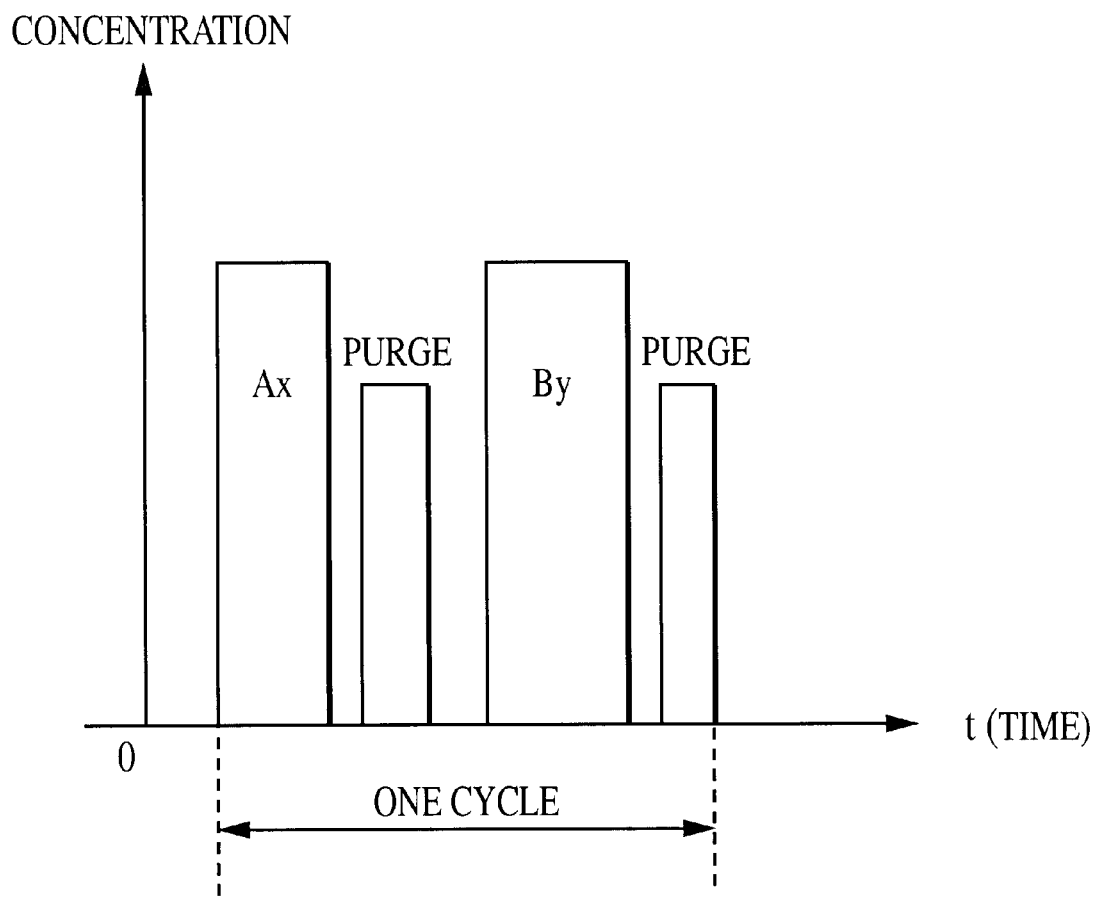
FIG. 1 is a conventional time diagram for atomic layer deposition gas pulsing.

In the following detailed description, reference is made to various specific embodiments in which the invention may be practiced. These embodiments are described with sufficient detail to enable those skilled in the art to practice the invention, and it is to be understood that other embodiments may be employed, and that structural, logical, and electrical changes may be made.

The term "substrate" used in the following description may include any semiconductor-based structure. Structure must be understood to include silicon, silicon-on insulator (SOI), silicon-on sapphire (SOS), doped and undoped semiconductors, epitaxial layers of silicon supported by a base semiconductor foundation, and other semiconductor structures. The semiconductor also need not be silicon-based. The semiconductor could be silicon-germanium, germanium, or gallium arsenide. When reference is made to a substrate in the following description, previous process steps may have been utilized to form regions or junctions in or on the base semiconductor or foundation.

The term "rhodium" is intended to include not only elemental rhodium, but rhodium with other trace metals or in various alloyed combinations with other metals as known in the semiconductor art, as long as such rhodium alloy is conductive.

The present invention provides a novel method for the formation of carbon-free rhodium films with good step coverage which could be used, for example, as top and/or lower plate electrodes for capacitors, as fuse elements or as seed layers for electroplating. According to an exemplary embodiment of the invention, rhodium films are formed by a low temperature atomic layer deposition technique using a gas precursor of dicarbonyl cyclopentadienyl rhodium (I) [CpRh(CO$_2$)] in an oxygen exposure. The invention provides, therefore, a method for forming smooth and continuous rhodium films which also have good step coverage and reduced carbon content.

Continuous and smooth rhodium films formed according to embodiments of the present invention employ atomic layer deposition (ALD) processes for achieving good step coverage. For a better understanding of the formation of the ultra-uniform thin rhodium layers according to the present invention, the ALD technique will be outlined below.

Generally, the ALD technique proceeds by chemisorption at the deposition surface of the substrate. The ALD process is based on a unique mechanism for film formation, that is the formation of a saturated monolayer of a reactive precursor molecules by chemisorption, in which reactive precursors are alternately pulsed into a deposition chamber. Each injection of a reactive precursor is separated by an inert gas purge or a pump cycle. Each injection also provides a new atomic layer on top of the previously deposited layers to form a uniform layer of solid film. This cycle is repeated according to the desired thickness of the film.

This unique ALD mechanism for film formation has several advantages over the current CVD technology mentioned above. First, because of the flux-independent nature of ALD, the design of the reactor is simple because the thickness of the deposited layer is independent of the amount of precursor delivered after the formation of the saturated monolayer. Second, interaction and high reactivity of precursor gases in the gas phase above the wafer is avoided since chemical species are introduced independently, rather than together, into the reactor chamber. Third, ALD allows almost a perfect step coverage over complex topography as a result of the self-limiting surface reaction.

To illustrate the general concepts of ALD, which will be further used in describing the method of the present invention, reference is now made to the drawings, where like elements are designated by like reference numerals. FIG. 1 illustrates one complete cycle in the formation of an AB solid material by atomic layer deposition. A first species Ax is deposited over an initial surface of a substrate as a first monolayer. A second species By is next applied over the Ax monolayer. The By species reacts with Ax to form compound AB. The Ax, By layers are provided on the substrate surface by first pulsing the first species (also called first precursor gas) Ax and then the second species (also called second precursor gas) By into the region of the surface. If thicker material layers are desired, the sequence of depositing Ax and By layers can be repeated as often as needed until a desired thickness is reached. Between each of the precursor gas pulses, the process region is purged with an inert gas or evacuated.

As illustrated in FIG. 1, a first pulse of precursor Ax is initially generated and followed by a transition time of no gas input. Subsequently, an intermediate pulse of a purge gas takes place, followed by another transition time. Precursor gas By is then pulsed, another transition time follows, and then a purge gas is pulsed again. Thus, a full complete cycle incorporates one pulse of precursor Ax and one pulse of precursor By, each precursor pulse being separated by a purge gas pulse.

Figure 2:
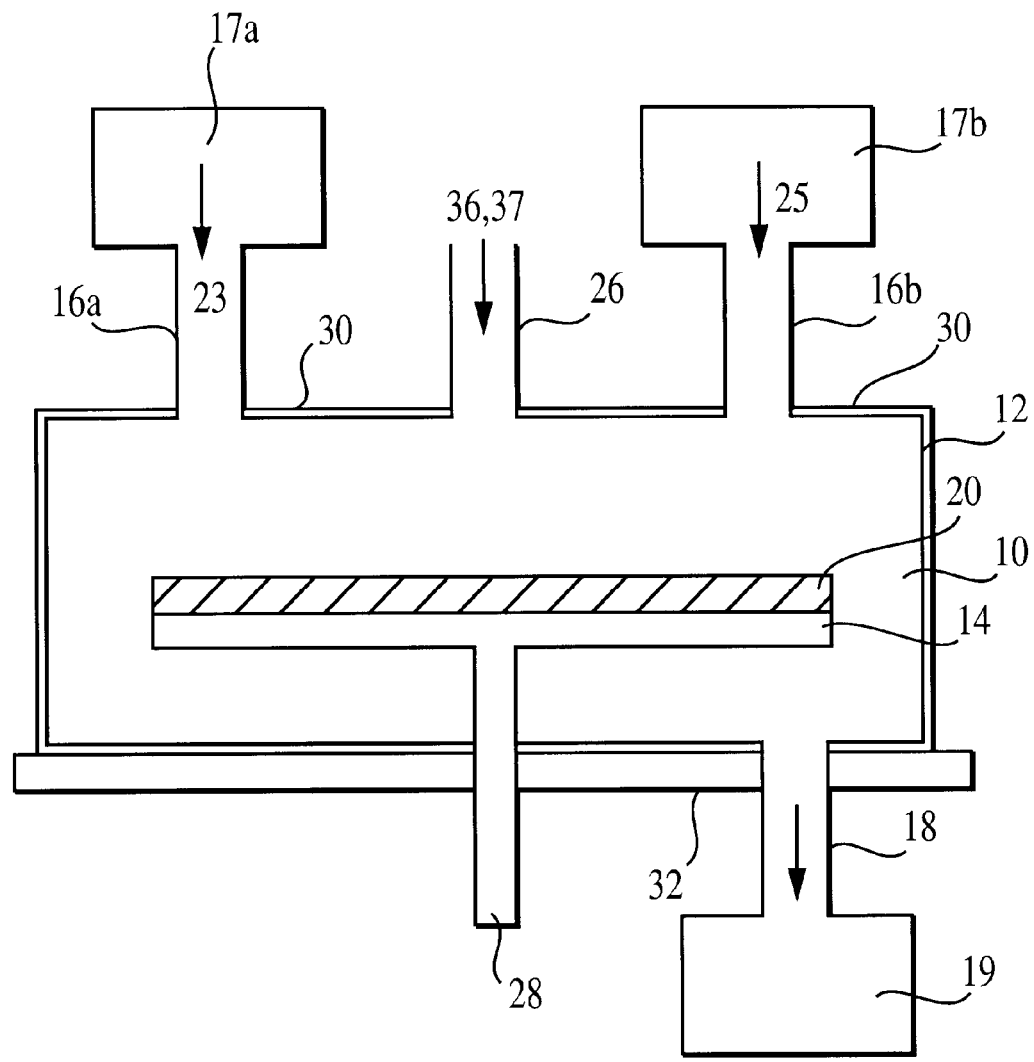
FIG. 2 is an elevation view of an atomic layer deposition (ALD) apparatus used for the formation of a rhodium film according to the present invention.

The cycle described above for the formation of an AB solid material by atomic layer deposition is employed in the formation of a rhodium film in a deposition apparatus, which is illustrated in FIG. 2. Such an apparatus includes a reactor chamber 10, which may be constructed as a quartz container, and a suscepter 14 which holds one or a plurality of semiconductor substrates, for example, semiconductor substrate 20, and which is mounted on the upper end of a shaft 28. Mounted on one of the chamber defining walls, for example on upper wall 30 of the reactor chamber 10, are reactive gas supply inlets 16a and 16b, which are further connected with reactive gas supply sources 17a, 17b supplying first and second gas precursors, respectively. An exhaust outlet 18, connected with an exhaust system 19, is situated on an opposite lower wall 32 of the reactor chamber 10. A purge gas inlet 26, connected to a purge gas system, is also provided on the upper wall 30 and in between the reactive gas supply inlets 16a and 16b.

According to an embodiment of the present invention, a first reactive gas precursor 23 (FIG. 2) of an organic rhodium group metal precursor is supplied into the reactor chamber 10 through the reactive gas inlet 16a. The first reactive gas precursor 23 flows at a right angle to the semiconductor 20 and reacts with its surface portion to form a rhodium monolayer. The first reactive gas precursor 23 (FIG. 2) of an organic rhodium group metal precursor may be any suitable organic compound which allows rhodium to deposit from the gas onto the surface of the semiconductor substrate 20. Thus, the organic rhodium group metal precursor may be, for example, an organic rhodium (I) group metal precursor and having at least one rhodium source compound selected from the group consisting of compounds of the formula (1):

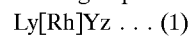

wherein:

L is independently selected from the group consisting of neutral and anionic ligands;

y is one of {1, 2, 3, 4} and more preferably 1;

Y is independently a pi-orbital bonding ligand selected from the group consisting of CO, NO, CN, CS, N$_2$, PX$_3$, PR$_3$, P(OR)$_3$, AsX$_3$, AsR$_3$, As(OR)$_3$, SbX$_3$, SbR$_3$, Sb(OR)$_3$, NH$_x$R$_{3-x}$, CNR, and RCN, wherein R is an organic group, X is a halide and x is one of {0, 1, 2, 3}; and z is one of {0, 1, 2, 3, 4}, preferably one of {1, 2, 3, 4}, more preferably one of {2, 3} and most preferably 2.

Thus, and in accordance with formula (1) outlined above, the first reactive gas precursor 23 (FIG. 2) of an organic rhodium group metal precursor may include, for example, rhodium beta-diketonates, rhodium aceylacetonate, alkyl rhodium dienes, or compounds including a carbon ring, for example, rhodium cyclopentadienyl derivatives such as dicarbonyl cyclopentadienyl rhodium [CpRh(CO)$_2$], among many others.

In an exemplary embodiment, vapors of dicarbonyl cyclopentadienyl rhodium [CpRh(CO)$_2$] are used as the first pulse of precursor 23 at a temperature of about 100° C. to about 200° C., more preferably of about 100° C. to about 150° C., at a rate of about 0.1 to 500 standard cubic centimeters per minute ("sccm"), more preferably of about 0.1 to 5 sccm, and for a duration of about 0.1 second to about 30 seconds, more preferably of about 0.2 second to about 10 seconds.

Although the reactions for the atomic layer deposition of rhodium are not known in the art, it is believed that organo-metallic rhodium precursor molecules chemisorb to the semiconductor substrate 20 forming an organo-rhodium monolayer. The surface is dosed long enough to ensure surface saturation. Thus, the organo-metallic rhodium precursor molecules attach to the initial surface of the semiconductor substrate 20 to form a complete and saturated organo-rhodium monolayer. Any excess rhodium gas precursor 23 in the reactor chamber 10 is then removed by either purging or evacuating the reactor chamber 10.

In an exemplary embodiment, after the first saturated organo-rhodium monolayer is formed and any of the remaining unreacted gas precursor 23 is completely exhausted through the exhaust inlet 18, a first purge gas 36 (FIG. 2) is then introduced into the reactor chamber 10 through the inlet 26. Although the present invention will be described with reference to the use of a purge gas, such as the first purge gas 36, it must be understood that the invention also contemplates the complete evacuation of the remaining unreacted gas precursor 23, by using a vacuum pump, for example, and without employing a purge gas.

The first purge gas 36 may be introduced into the reactor chamber 10 after about 1 second from the complete exhaustion of the unreacted rhodium precursor 23, and for a purge duration of about 0.1 second to about 10 seconds. The first purge gas 36 is fed into the reactor chamber 10 at a rate of about 0 to about 1,000 sccm, more preferably of about 10 to 500 sccm, most preferably of about 10 to 200 sccm. The flow rate of the first purge gas 36 into the reactor chamber 10 is determined based on the rhodium group metal to be deposited, as well as on the substrate on which rhodium is deposited and the temperature and pressure at which the atomic layer deposition takes place. Preferable gases for the first purge gas 36 are helium (He), argon (Ar), or nitrogen (N) among others, with helium most preferred.

The substrate 20, with the deposited saturated organo-rhodium monolayer, is then exposed to a second reactive gas precursor 25, shown in FIG. 2. The second reactive gas precursor 25 is supplied into the reactor chamber 10 through the reactive gas inlet 16a and also flows at a right angle onto the semiconductor 20 and the saturated organo-rhodium monolayer.

According to the present invention, the second reactive gas precursor 25 is oxygen ($O_2$) which is fed into the reactor chamber 10 at a rate of about 1 to 500 sccm, most preferably of about 10 to 200 sccm, and for a duration of about 0.1 second to about 30 seconds, more preferably of about 1 second to about 10 seconds, which is carefully tailored according to the other ALD parameters so that saturation of the available surface sites is reached, and the organic component of the organo-rhodium monolayer is completely converted to a metallic rhodium film. The flow rate of oxygen is also determined based on the rhodium group metal to be deposited, as well as on the substrate on which rhodium is deposited and the temperature and pressure at which the atomic layer deposition takes place.

Although the precise details of the formation of the rhodium monolayer are unknown, it is believed that oxygen facilitates removal of the cyclopentadienyl (Cp) ring of the dicarbonyl cyclopentadienyl rhodium [$CpRh(CO)_2$] gas precursor as well as the removal or the oxidation of carbonyl groups, such as (CO) groups, to ($CO_2$) groups. Thus, along with the ($CO_2$) groups, the carbon from the deposited saturated organo-rhodium monolayer is removed and a pure metallic rhodium layer forms on the surface of the substrate 20. This way, carbon contamination is greatly reduced as carbon is removed with the use of oxygen. Accordingly, the rhodium layer formed by ALD at low temperatures has a pure metallic composition, improved smoothness and uniformity and an extremely high step coverage.

Any remaining reactive oxygen precursor 25 in the reactive chamber 10 is exhausted through the exhaust inlet 18. An intermediate pulse of a second purge gas 37 is then introduced into the reactor chamber 10 through the inlet 26. The second purge gas 37 may be introduced into the reactor chamber 10 for a purge duration of about 0.1 second to about 10 seconds. The second purge gas 37 is fed into the reactor chamber 10 at a rate of about 0 to about 1,000 sccm, more preferably of about 10 to 500 sccm, most preferably of about 10 to 200 sccm. The flow rate of the second purge gas 37 into the reactor chamber 10 is determined based on rhodium group metal to be deposited, as well as on the substrate on which rhodium is deposited and the temperature and pressure at which the atomic layer deposition takes place. Preferable gases for the second purge gas 37 are helium (He), argon (Ar), or nitrogen (N) among others, with helium most preferred. As noted above, the invention is not limited to the use of a purge gas, such as the second purge gas 37, and the invention also contemplates the complete evacuation of the reactive oxygen precursor 25 instead of employing a purge gas.

As explained above, this cycle could be repeated for a number of times, according to the desired thickness of the deposited rhodium film. Assuming that 1 Angstrom of rhodium film is deposited per one ALD cycle, then the formation of a rhodium film with a thickness of about 300 Angstroms, for example, will require about 300 ALD cycles.

The low temperature atomic layer rhodium deposition of the present invention is useful for forming rhodium seed layers for electroplating, catalyst beds in industrial chemical processes, for example in coating applications requiring catalytic converters, or in forming rhodium bond pads, among others. Further, the low temperature atomic layer rhodium deposition forms rhodium films with good step coverage onto the surface of any substrate. While the method is useful for rhodium deposition onto any surface, the method has particular importance for rhodium films formed on surfaces used in integrated circuits. For example, rhodium films with good step coverage may be formed according to the present invention onto borophosphosilicate (BPSG), silicon, polysilica glass (PSG), titanium, oxides, polysilicon or silicides, among others. The invention is further explained with reference to the formation of a rhodium electrode, for example an upper capacitor plate or upper electrode, of a metal-insulator-metal (MIM) capacitor.

Although the present invention will be described below with reference to a metal-insulator-metal (MIM) capacitor (FIGS. 3–4) that has an upper capacitor plate 77 (FIG. 4) formed of rhodium deposited by low temperature ALD, it must be understood that the present invention is not limited to MIM capacitors having a rhodium upper capacitor plate, but it also covers other capacitor structures, such as, for example, conventional capacitors or metal-insulator-semiconductor (MIS) capacitors used in the fabrication of various IC memory cells, as long as one or both of the capacitor plates are formed of rhodium deposited by low temperature ALD.

Figure 3:
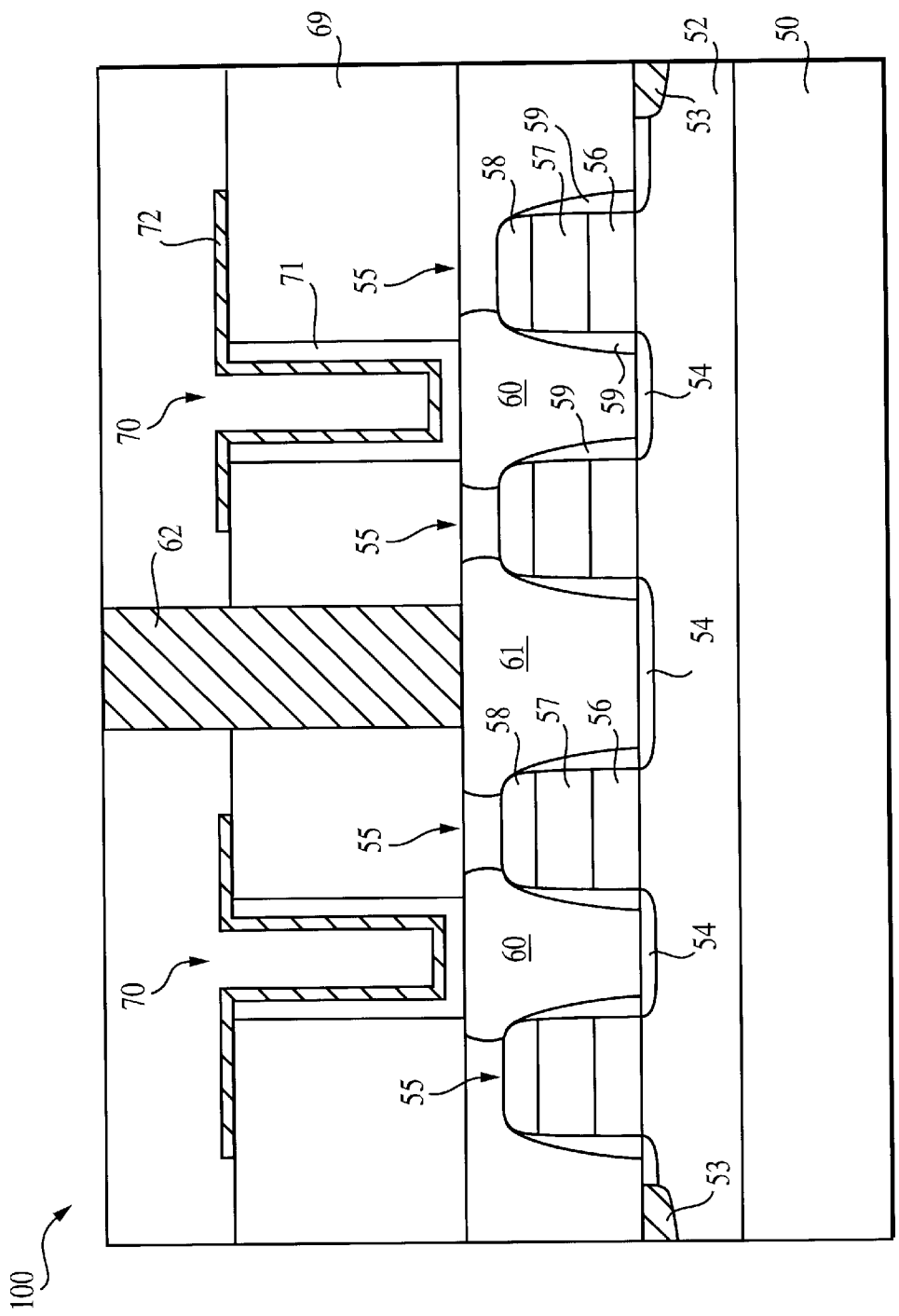
FIG. 3 illustrates a schematic cross-sectional view of a DRAM device on which an upper capacitor rhodium plate will be formed according to a method of the present invention.

Referring now to the drawings, FIG. 3 shows a portion 100 of a conventional DRAM memory at an intermediate stage of the fabrication. A pair of memory cells having respective access transistors are formed on a substrate 50 having a doped well 52, which is typically doped to a predetermined conductivity, e.g. P-type or N-type depending on whether NMOS or PMOS transistors will be formed. The structure further includes field oxide regions 53, conventional doped active areas 54, and a pair of gate stacks 55, all formed according to well-known semiconductor processing techniques. The gate stacks 55 include an oxide layer 56, a conductive gate layer 57, spacers 59 formed of an oxide or a nitride, and a cap 58 which can be formed of an oxide, an oxide/nitride, or a nitride. The conductive gate layer 57 could be formed, for example, of a layer of doped polysilicon, or a multi-layer structure of polysilicon/$WSi_x$, polysilicon/$WN_x$/W or polysilicon/$TiSi_2$.

Further illustrated in FIG. 3 are two MIM capacitors 70, at an intermediate stage of fabrication and formed in an insulating layer 69, which are connected to active areas 54 by two respective conductive plugs 60. The DRAM memory cells also include a bit line contact 62, which is further connected to the common active area 54 of the access transistors by another conductive plug 61. The access transistors respectively write charge into and read charge from capacitors 70, to and from the bit line contact 62.

The processing steps for the fabrication of the MIM capacitor 70 (FIG. 3) provided in the insulating layer 69 include a first-level metallization 71, a dielectric film 72 deposition, and a second-level metallization. For example, FIG. 3 illustrates the MIM capacitor 70 after formation of the dielectric film 72. As such, a lower capacitor plate 71, also called a bottom or lower electrode, has already been formed during the first-level metallization. The material for the lower capacitor plate 71 is typically selected from the group of metals, or metal compositions and alloys, including but not limited to osmium (Os), platinum (Pt), rhodium (Rh) ruthenium (Ru), palladium (Pd), iridium (Ir), and their alloys.

Following the first-level deposition, the first level metallization is removed from the top surface regions typically by resist coat and CMP or dry etch. A high dielectric film 72 (FIG. 3) is formed over the lower capacitor plate 71. The most common high dielectric material used in MIM capacitors is tantalum oxide ($Ta_2O_5$), but other materials such as strontium titanate ($SrTiO_3$), alumina ($Al_2O_3$), barium strontium titanate ($BaSrTiO_3$), or zirconium oxide ($ZrO_2$) may also be used. Further, perovskite oxide dielectric films of the paraelectric type, such as lead titanate ($PbTiO_3$) or lead zirconite ($PbZrO_3$), are also good candidates for high dielectric film materials even if their dielectric constant is slightly lower than that of the above mentioned dielectrics. As known in the art, the thickness of the high dielectric film 72 determines the capacitance per unit area of the MIM capacitor 70.

After the formation of the dielectric film 72 (FIG. 3), a second-level metallization is performed during which a rhodium film 77 (FIG. 4) is formed by the low temperature ALD method described in detail above, to complete the formation of the MIM capacitor 70. Thus, the substrate 50 is introduced in the reactor chamber 10 of the apparatus of FIG. 2 so that a first reactive gas precursor 23 (FIG. 2) of an organic rhodium metal group precursor is pulsed over the substrate 50. According to the present invention, the first reactive gas precursor 23 (FIG. 2) of an organic rhodium group metal precursor may be, for example, any suitable organic compound with formula Ly[Rh]Yz, which allows rhodium to deposit from the gas onto the surface of the semiconductor substrate 50 and having at least one rhodium source compound selected from the group consisting of compounds of the formula (1) outlined above. In a preferred embodiment, vapors of dicarbonyl cyclopentadienyl rhodium [$CpRh(CO_2)$] are used as the first pulse of precursor 23 at a temperature of about 100° C. and for about 5 seconds. The surface of the substrate 50 is dosed long enough to ensure saturation and to form an organ-rhodium monolayer that is saturated.

After any of the remaining unreacted [$CpRh(CO_2)$] is completely exhausted through the exhaust inlet 18 (FIG. 2), a first purge gas 36 is then introduced into the reactor chamber 10 through the inlet 26. In an exemplary embodiment, the first purge gas 36 is helium which is introduced into the reactor chamber 10 after the complete exhaustion of the unreacted [$CpRh(CO_2)$] and for a purge duration of about 0.1 second to about 10 seconds. The helium is fed into the reactor chamber 10 at a rate of about 50 sccm.

Figure 4:
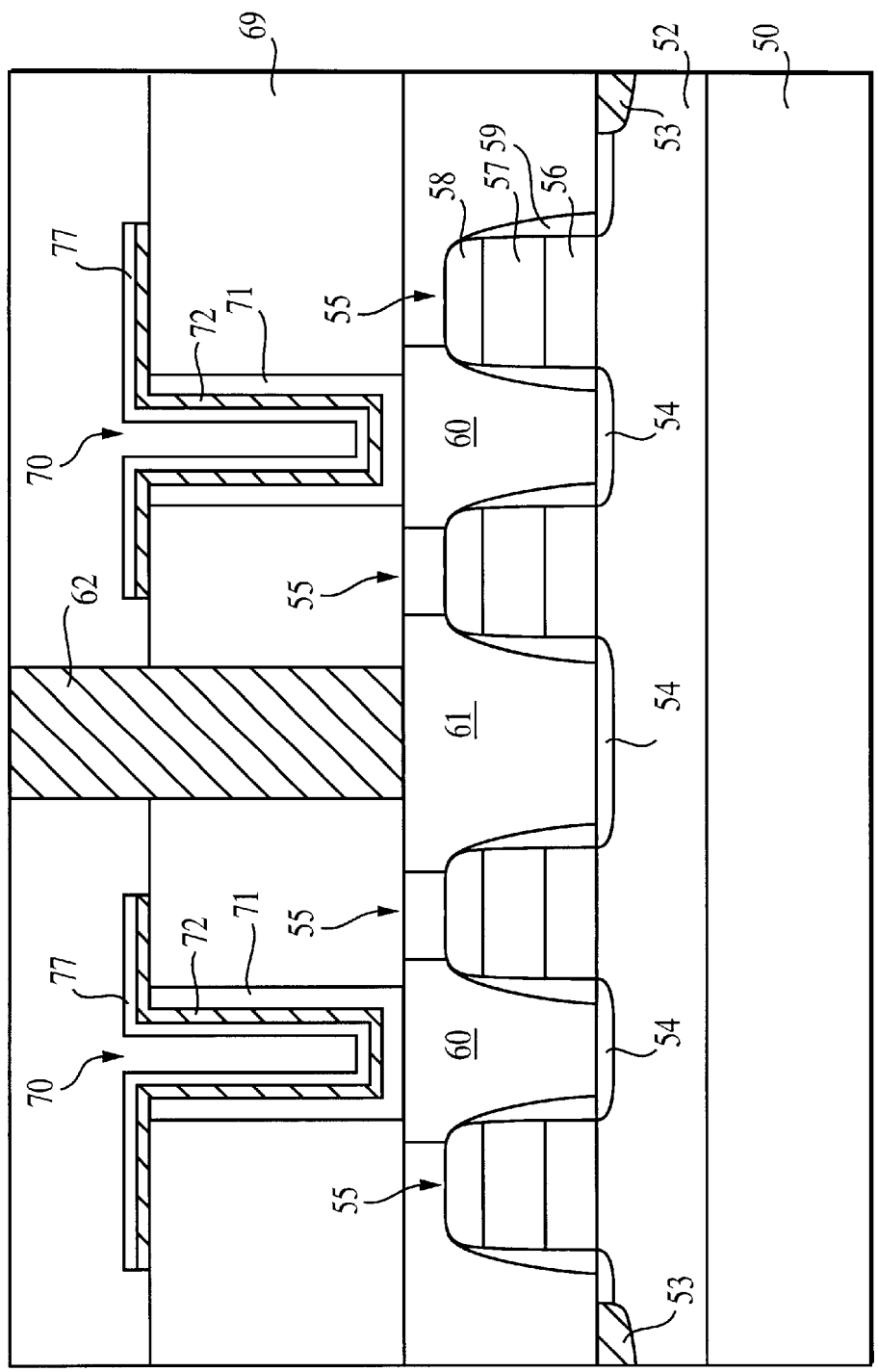
FIG. 4 illustrates a schematic cross-sectional view of the DRAM device of FIG. 4 at a stage of processing subsequent to that shown in FIG. 4.

The semiconductor 50 is then exposed to a second reactive gas precursor 25, shown in FIG. 2. The second reactive gas precursor 25 is supplied into the reactor chamber 10 through the reactive gas inlet 16a and also flows at a right angle onto the semiconductor 50 and the organo-rhodium monolayer. In an exemplary embodiment, the second reactive gas precursor 25 is oxygen ($O_2$) which is fed into the reactor chamber 10 at a rate of about 50 sccm, and for a duration of about 1 second. Any remaining reactive oxygen in the reactive chamber 10 is exhausted through the exhaust inlet 18. An intermediate pulse of a second purge gas 37 is then introduced into the reactor chamber 10 through the inlet 26. In a preferred embodiment, the second purge gas 37 is helium which is introduced into the reactor chamber 10 after about 1 second from the complete exhaustion of the unreacted oxygen and for a purge duration of about 0.1 second to about 10 seconds. The helium is fed into the reactor chamber 10 at a rate of about 50 sccm. The cycle is repeated until a metallic pure rhodium film 77 is formed to a desired thickness as an upper capacitor plate or upper electrode, which is shown in FIG. 4. Although FIG. 4 shows the rhodium film 77 as a patterned upper capacitor plate, those skilled in the art will realize that the rhodium film formed by the ALD method of the present invention is initially formed as a blanket-deposited layer over the dielectric film 72 and then both the rhodium layer and the dielectric film 72 are patterned and etched according to known methods of the art to obtain the capacitor structure of FIG. 4.

The low temperature atomic layer rhodium film 77 (FIG. 4) formed according to the present invention has good step coverage and enhanced uniformity and purity due to the complete reaction during ALD steps.

Figure 5:
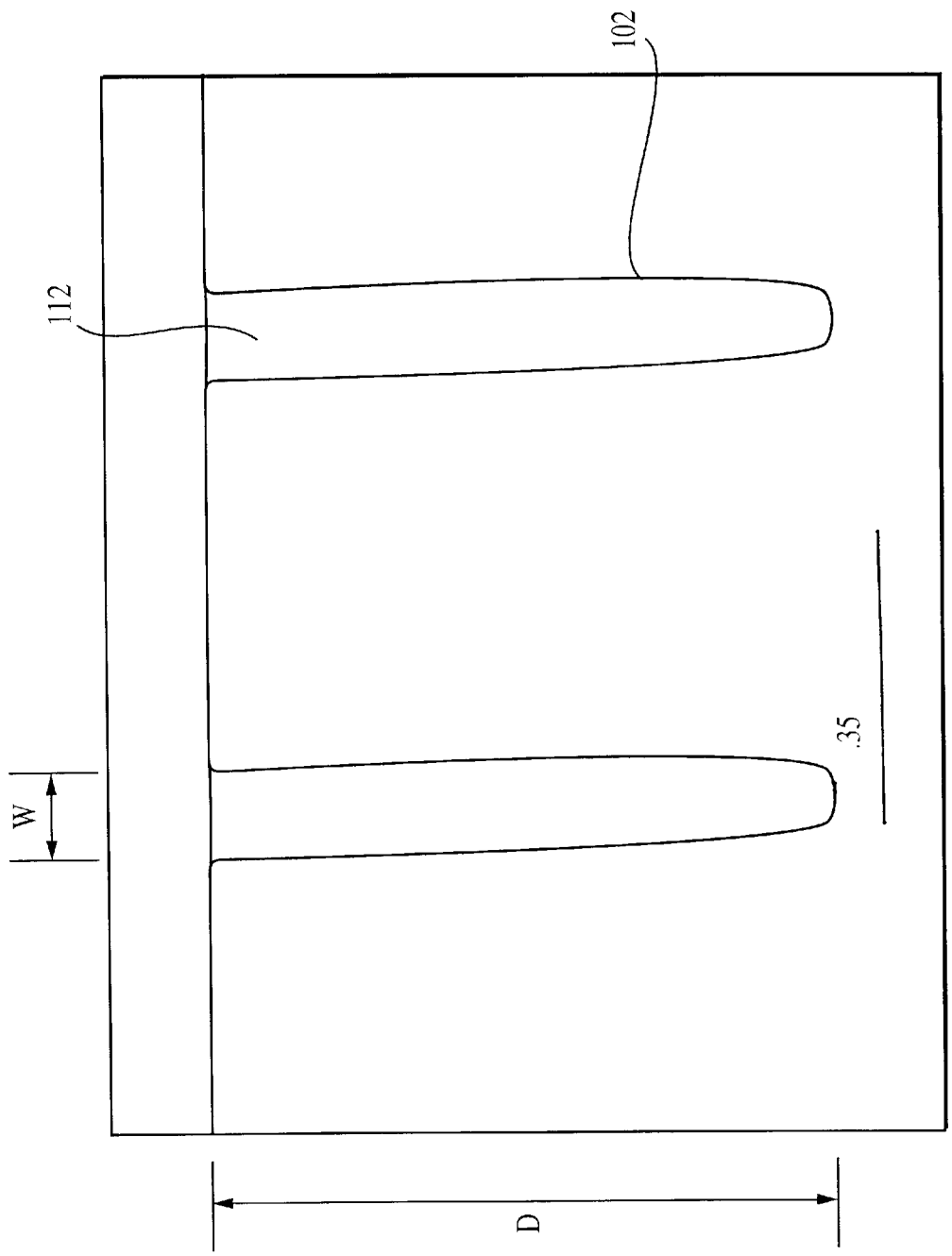
FIG. 5 is an ink copy of a scanning electron microscopic (SEM) micrograph of a rhodium film deposited by a method of the present invention.

To illustrate the enhanced properties of the rhodium films formed at low temperature ALD processing, reference in now made to FIG. 5 which illustrates an ink copy of a scanning electron microscopic (SEM) micrograph of a pure metallic rhodium film 102 deposited by low temperature ALD method of the present invention (FIG. 5). As shown in FIG. 5, the ALD-deposited rhodium film 102 formed in test structure 112 of FIG. 5 has improved step coverage without poor film nucleation. The test structure 112, which may be for example a contact hole between a capacitor and a transistor, has a very narrow width W (FIG. 5) of about 0.15 microns and a large length D (FIG. 5) of about 1 micron.

The rhodium film 102 of FIG. 5 shows extremely good step coverage and enhanced physical properties, such as smoothness and purity. The rhodium film 102 of FIG. 5 was deposited at about 100° C. by atomic layer deposition under the following conditions:

EXAMPLE first precursor: 5 sccm dicarbonyl cyclopentadienyl rhodium [$CpRh(CO_2)$] at about 100° C. and for about 5 seconds first purge gas: 50 sccm He for about 5 seconds second precursor: 50 sccm O₂ for about 5 seconds second purge gas: 50 sccm He for about 5 seconds Although the invention has been described with reference to the formation of an upper rhodium plate of an MIM capacitor, the invention is not limited to the above embodiments. Thus, the invention contemplates the formation of high quality rhodium films with good step coverage that can be used in a variety of IC structures, for example as seed layers for electroplating processes, as fuse elements or as bond pads, among many others.

Figure 6:
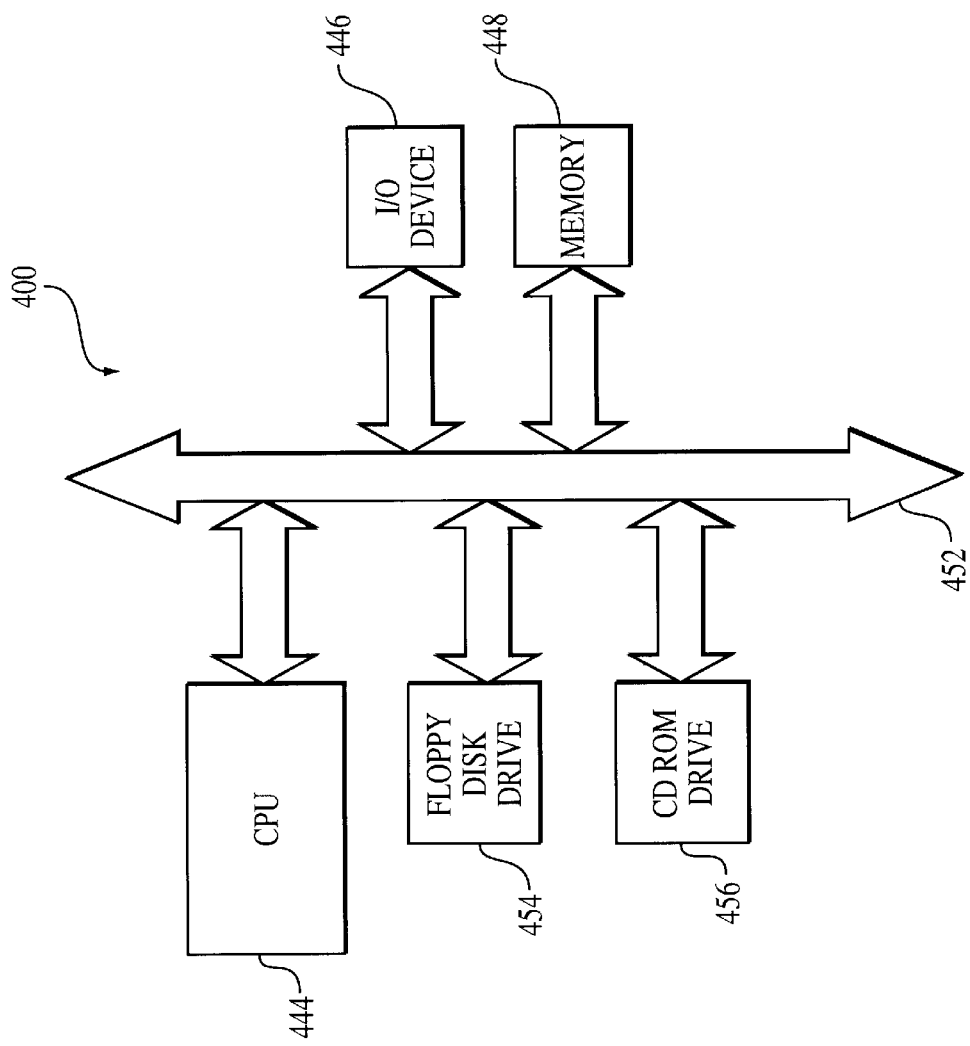
FIG. 6 is an illustration of a computer system having a memory device including a rhodium film formed according to a method of the present invention.

The MIM capacitor 70 of FIG. 4 including the rhodium film 77 formed according to a method of the present invention could further be part of a memory device of a typical processor based system, which is illustrated generally at 400 in FIG. 6. A processor system, such as a computer system, generally comprises a central processing unit (CPU) 444, such as a microprocessor, which communicates with an input/output (I/O) device 446 over a bus 452. A memory 448, for example a DRAM memory, a SRAM memory, or a Multi Chip Module (MCM), also communicates with the CPU 444 over bus 452. Either the processor and/or memory or other circuit elements fabricated as an integrated circuit may use a conductor, for example, a conductor used in a capacitor 70 including a rhodium film 77 fabricated as described above with reference to FIGS. 3–4.

In the case of a computer system, the processor system may include additional peripheral devices such as a floppy disk drive 454, and a compact disk (CD) ROM drive 456 which also communicate with CPU 444 over the bus 452. The memory 448 may be combined with a processor, such as a CPU, digital signal processor or microprocessor, with or without memory storage, in a single integrated circuit chip.

The above description illustrates preferred embodiments that achieve the features and advantages of the present invention. It is not intended that the present invention be limited to the illustrated embodiments. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A method for conducting atomic layer deposition of rhodium on a substrate comprising the steps of:

positioning said substrate in a deposition region of a reactor chamber;

introducing a rhodium group metal precursor into said reactor chamber to deposit a rhodium monolayer on said substrate; and introducing oxygen into said deposition region to remove carbon from said rhodium monolayer and to obtain a substantially pure metallic rhodium layer.

2. The method of claim 1, wherein said rhodium group metal precursor comprises an organic rhodium group metal precursor having the formula Ly{Rh}Yz, wherein L is independently selected from the group consisting of neutral and anionic ligands; y is one of {1, 2, 3, 4}; Y is independently a pi-orbital bonding ligand selected from the group consisting of CO, NO, CN, CS, N₂, PX₃, PR₃, P(OR)₃, AsX₃, AsR₃, As(OR)₃, SbX₃, SbR₃, Sb(OR)₃, NH$_x$R$_{3-x}$, CNR, and RCN, wherein R is an organic group, X is a halide and x is one of {0, 1, 2, 3}; and z is one of {0, 1, 2, 3, 4}.

3. The method of claim 2, wherein said rhodium group metal precursor is dicarbonyl cyclopentadienyl rhodium.

4. The method of claim 1, wherein said atomic layer deposition is performed at a temperature of about 100° C. to about 200° C.

5. The method of claim 4, wherein said atomic layer deposition is performed at a temperature of about 100° C. to about 150° C.

6. The method of claim 1, wherein said rhodium group metal precursor is introduced into said reactor chamber at a rate of about 0.1 to about 500 sccm.

7. The method of claim 1, wherein said rhodium group metal precursor is introduced into said reactor chamber at a rate of about 0.1 to about 5 sccm.

8. The method of claim 1, wherein said oxygen is introduced into said reactor chamber at a rate of about 1 to about 500 sccm.

9. The method of claim 8, wherein said oxygen is introduced into said reactor chamber at a rate of about 10 to about 200 sccm.

10. The method of claim 1 further comprising introducing a first gas into said reactor chamber after said step of introducing said rhodium group metal precursor and before said step of introducing oxygen.

11. The method of claim 10, wherein said first gas is selected from the group consisting of helium, argon and nitrogen.

12. The method of claim 10 further comprising introducing a second gas into said reactor chamber after said step of introducing oxygen.

13. The method of claim 12, wherein said second gas is selected from the group consisting of helium, argon and nitrogen.

14. A method for conducting atomic layer deposition of rhodium on an integrated circuit material layer, said method comprising the steps of:

positioning said material layer in a deposition region of a reactor chamber;

introducing dicarbonyl cyclopentadienyl rhodium into said deposition region of said reactor chamber to deposit a rhodium monolayer on said material layer at a temperature of about 100° C. to about 200° C.; and introducing oxygen into said deposition region of said reactor chamber to remove carbon atoms from said rhodium monolayer and to obtain a substantially pure metallic rhodium layer.

15. The method of claim 14, wherein said atomic layer deposition is performed at a temperature of about 100° C. to about 150° C.

16. The method of claim 15, wherein said atomic layer deposition is performed at a temperature of about 100° C.

17. The method of claim 14, wherein said dicarbonyl cyclopentadienyl rhodium is introduced into said reactor chamber at a rate of about 0.1 to about 500 sccm.

18. The method of claim 17, wherein said dicarbonyl cyclopentadienyl rhodium is introduced into said reactor chamber at a rate of about 5 sccm.

19. The method of claim 14, wherein said oxygen is introduced into said reactor chamber at a rate of about 10 to about 500 sccm.

20. The method of claim 19, wherein said oxygen is introduced into said reactor chamber at a rate of about 50 sccm.

21. The method of claim 14 further comprising introducing helium into said reactor chamber after said step of introducing said dicarbonyl cyclopentadienyl rhodium and before said step of introducing oxygen, at a rate of about 50 sccm and for about 5 seconds.

22. The method of claim 14 further comprising introducing helium into said reactor chamber after said step of introducing oxygen, at a rate of about 50 sccm and for about 5 seconds.

23. A method for conducting atomic layer deposition of rhodium on an integrated circuit material layer comprising the steps of:

positioning said material layer in a deposition region of a reactor chamber with a temperature of about 100° C. to about 200° C.;

introducing dicarbonyl cyclopentadienyl rhodium into said reactor chamber at a rate of about 0.1 to about 500 sccm and for about 0.1 to about 30 seconds to deposit a rhodium monolayer on said material layer;

introducing a first purge gas at a rate of about 10 to about 200 sccm and for about 0.1 to about 10 seconds;

introducing oxygen into said deposition region at a rate of about 10 to about 200 sccm and for about 0.1 to about 10 seconds, and removing carbon atoms from said rhodium monolayer to obtain a substantially pure metallic rhodium layer; and introducing a second purge gas at a rate of about 10 to about 200 sccm and for about 0.1 to about 10 seconds.

24. The method of claim 23, wherein said atomic layer deposition of rhodium is conducted at a temperature of about 100° C.

25. The method of claim 23, wherein said dicarbonyl cyclopentadienyl rhodium is introduced into said reactor chamber at a rate of about 5 sccm and for about 5 seconds.

26. The method of claim 23, wherein said oxygen is introduced into said reactor chamber at a rate of about 50 sccm and for about 5 seconds.

27. The method of claim 23, wherein said first and said second purge gases are each introduced into said reactor chamber at a rate of about 50 sccm and for about 5 seconds.

28. A method for conducting atomic layer deposition of rhodium on a substrate consisting essentially of:

positioning said substrate in a deposition region of a reactor chamber;

introducing a rhodium group metal precursor into said reactor chamber to deposit a rhodium monolayer on said substrate;

introducing a first gas into said reactor chamber;

introducing oxygen into said deposition region to remove carbon from said rhodium monolayer and to obtain a substantially pure metallic rhodium layer; and introducing a second gas into said reactor chamber.

29. The method of claim 28, wherein said rhodium group metal precursor comprises an organic rhodium group metal precursor having the formula Ly{Rh}Yz, wherein L is independently selected from the group consisting of neutral and anionic ligands; y is one of {1, 2, 3, 4}; Y is independently a pi-orbital bonding ligand selected from the group consisting of CO, NO, CN, CS, $N_2$, $PX_3$, $PR_3$, $P(OR)_3$, $AsX_3$, $AsR_3$, $As(OR)_3$, $SbX_3$, $SbR_3$, $Sb(OR)_3$, $NH_xR_{3-x}$, CNR, and RCN, wherein R is an organic group, X is a halide and x is one of {0, 1, 2, 3}; and z is one of {0, 1, 2, 3, 4}.

30. The method of claim 29, wherein said atomic layer deposition is performed at a temperature of about 100° C. to about 200° C.

31. The method of claim 28, wherein said rhodium group metal precursor is introduced into said reactor chamber at a rate of about 0.1 to about 500 sccm.

32. The method of claim 28, wherein said oxygen is introduced into said reactor chamber at a rate of about 1 to about 500 sccm.

33. The method of claim 28, wherein said first gas is selected from the group consisting of helium, argon and nitrogen.

34. The method of claim 28, wherein said second gas is selected from the group consisting of helium, argon and nitrogen.

35. A method for conducting atomic layer deposition of rhodium on an integrated circuit material layer, said method consisting essentially of:

positioning said material layer in a deposition region of a reactor chamber;

introducing dicarbonyl cyclopentadienyl rhodium into said deposition region of said reactor chamber to deposit a rhodium monolayer on said material layer at a temperature of about 100° C. to about 200° C.;

introducing helium into said reactor chamber at a rate of about 50 sccm and for about 5 seconds;

introducing oxygen into said deposition region of said reactor chamber to remove carbon atoms from said rhodium monolayer and to obtain a substantially pure metallic rhodium layer; and introducing helium into said reactor chamber at a rate of about 50 sccm and for about 5 seconds.

36. The method of claim 35, wherein said dicarbonyl cyclopentadienyl rhodium is introduced into said reactor chamber at a rate of about 0.1 to about 500 sccm.

37. The method of claim 35, wherein said oxygen is introduced into said reactor chamber at a rate of about 10 to about 500 sccm.

* * * * *